(12) United States Patent
Lee et al.

(10) Patent No.: US 9,412,588 B2
(45) Date of Patent: Aug. 9, 2016

(54) METHOD OF GROWING NITRIDE SEMICONDUCTOR LAYER AND NITRIDE SEMICONDUCTOR FORMED BY THE SAME

(71) Applicant: Samsung Electronics Co., Ltd., Suwon-Si, Gyeonggi-Do (KR)

(72) Inventors: Moon-sang Lee, Seoul (KR); Sung-soo Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/505,181

(22) Filed: Oct. 2, 2014

(65) Prior Publication Data

US 2015/0099348 A1 Apr. 9, 2015

(30) Foreign Application Priority Data

Oct. 7, 2013 (KR) ........................ 10-2013-0119447

(51) Int. Cl.
*H01L 21/02* (2006.01)

(52) U.S. Cl.
CPC ........ *H01L 21/0254* (2013.01); *H01L 21/0265* (2013.01); *H01L 21/02458* (2013.01); *H01L 21/02472* (2013.01); *H01L 21/02507* (2013.01); *H01L 21/02513* (2013.01); *H01L 21/02642* (2013.01)

(58) Field of Classification Search
CPC ..... H01L 51/5203; H01L 51/56; H01L 51/52; H01L 27/3258; H01L 2227/323; H01L 27/3248
See application file for complete search history.

(56) References Cited

U.S. PATENT DOCUMENTS

| 4,361,461 A * | 11/1982 | Chang ........................ 438/710 |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |

(Continued)

FOREIGN PATENT DOCUMENTS

JP          3631724 B2    3/2005
KR    10-2005-0029735 A    3/2005

(Continued)

*Primary Examiner* — Michelle Mandala
(74) *Attorney, Agent, or Firm* — Harness, Dickey & Pierce, P.L.C.

(57) ABSTRACT

A method of growing a nitride semiconductor layer includes forming a plurality of nano-structures on a substrate, forming a first buffer layer on the substrate such that upper portions of each of the nano-structures are exposed, removing the nano-structures to form voids in the first buffer layer, and growing a nitride semiconductor layer on the first buffer layer including the voids.

20 Claims, 11 Drawing Sheets

(56) References Cited

U.S. PATENT DOCUMENTS

| | | |
|---|---|---|
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,383,494 B2 | 2/2013 | Han et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2005/0142876 A1* | 6/2005 | Katona et al. ................. 438/688 |
| 2006/0154451 A1* | 7/2006 | Park ........................ C30B 25/04 438/479 |
| 2006/0292777 A1* | 12/2006 | Dunbar ........................ 438/197 |
| 2012/0091094 A1* | 4/2012 | Lee ........................ B82Y 40/00 216/11 |
| 2012/0235115 A1 | 9/2012 | Kang et al. |
| 2012/0235161 A1 | 9/2012 | Paskova et al. |
| 2012/0280208 A1 | 11/2012 | Jain |
| 2012/0280243 A1 | 11/2012 | Lee et al. |
| 2012/0286289 A1 | 11/2012 | Dipalo et al. |
| 2012/0291862 A1 | 11/2012 | Jiawook |
| 2012/0315742 A1 | 12/2012 | Yui et al. |
| 2012/0319131 A1 | 12/2012 | Park et al. |
| 2013/0001094 A1 | 1/2013 | Cable et al. |
| 2013/0009167 A1 | 1/2013 | Tan et al. |
| 2013/0021669 A1 | 1/2013 | Xi et al. |
| 2013/0036928 A1 | 2/2013 | Rogers et al. |
| 2013/0048945 A1 | 2/2013 | Fang et al. |
| 2013/0095591 A1 | 4/2013 | Yu et al. |
| 2013/0095641 A1 | 4/2013 | Lim et al. |
| 2013/0105438 A1 | 5/2013 | Zhu et al. |
| 2013/0105809 A1 | 5/2013 | Chang |
| 2013/0112379 A1 | 5/2013 | Ko et al. |
| 2013/0114133 A1 | 5/2013 | Sarto et al. |
| 2013/0126867 A1* | 5/2013 | Wang et al. ..................... 257/52 |
| 2013/0187124 A1* | 7/2013 | Zhang et al. ..................... 257/13 |

FOREIGN PATENT DOCUMENTS

| | | |
|---|---|---|
| KR | 10-2012-0134774 A | 12/2012 |
| KR | 10-2013-0035685 A | 4/2013 |

* cited by examiner

METHOD OF GROWING NITRIDE SEMICONDUCTOR LAYER AND NITRIDE SEMICONDUCTOR FORMED BY THE SAME

CROSS REFERENCE TO RELATED APPLICATIONS

This application claims the benefit of Korean Patent Application No. 10-2013-0119447, filed on Oct. 7, 2013, in the Korean Intellectual Property Office, the disclosure of which is incorporated herein in its entirety by reference.

BACKGROUND

1. Field

Some example embodiments relate to methods of growing a nitride semiconductor layer and/or a nitride semiconductor formed by using the same, and more particularly, to methods of growing a nitride semiconductor layer and/or a nitride semiconductor formed by using the same.

2. Description of the Related Art

An electronic industry that uses a nitride semiconductor draws attention as a field that accords with the development and growth of green industries. In particular, gallium nitride (GaN) semiconductor, which is one of a nitride semiconductor, is widely used in light-emitting diode (LED) display devices and backlights. Also, due to lower power consumption and longer lifetime than light bulbs and fluorescent lamps of the related art, the usage of LEDs is expanding to general illumination purposes by replacing incandescent bulbs and fluorescent lamps. Of red, green, and blue light-emitting diodes, GaN is widely used for manufacturing a blue light-emitting diode, which is a core diode of high output electronic parts that include LEDs. This is because a blue light-emitting diode that uses GaN has superior brightness, lifetime, and internal quantum efficiency to those of zinc selenide (ZnSe), which is a conventional semiconductor material of a light-emitting diode that emits light in a blue light range. Also, GaN has a direct transitional band gap structure and a band gap that can be controlled to a level of 1.9-6.2 eV through an alloy with In (Indium) or Al (Aluminum), and thus, GaN may be used for manufacturing semiconductor layers that emit green, blue, and white lights. That is, since an emitted wavelength can be controlled by controlling the band gap, the characteristics of GaN may be adjusted according to the characteristics of a specific device.

For example, since a white LED that can replace a blue light LED and incandescent bulbs that are useful for optical recording may be manufactured by using GaN, GaN has a very high value for use in an optical device. Also, since GaN has a high breakdown voltage and is stable at a high temperature, GaN is useful in various fields such as high output devices or high temperature devices that cannot be formed by other materials. For example, GaN may be applied to a large display panel that uses a full color display, a signal lamp, a light source of optical recording media, or a high output transistor of motor vehicles.

SUMMARY

Some example embodiments provide methods of growing a nitride semiconductor layer and/or a nitride semiconductor formed using the same method. The methods of growing a nitride semiconductor layer reduce cracks that may occur due to a lattice constant difference and a thermal expansion coefficient difference between a hetero-substrate and the nitride semiconductor layer, and the hetero-substrate may be formed of a different material than that used to form the nitride semiconductor layer.

Additional aspects will be set forth in part in the description which follows and, in part, will be apparent from the description, or may be learned by practice of the presented embodiments.

According to an example embodiment of the inventive concepts, a method of growing a nitride semiconductor layer includes forming a plurality of nano-structures on a substrate, forming a first buffer layer on the substrate such that upper portions of each of the nano-structures are exposed, removing the nano-structures to form voids in the first buffer layer, and growing a nitride semiconductor layer on the first buffer layer including the voids.

The plurality of nano-structures may be formed using a spin coating method. The plurality of nano-structures may be formed to have a size in a range from about 100 nm to about 500 nm. The plurality of nano-structures may include an oxide. The plurality of nano-structures may include at least one of $SO_2$, $TiO_2$, $\beta\text{-}Ga_2O_3$, $Ta_2O_5$, and $RuO_2$. The first buffer layer may have a thickness that is smaller than that of the nano-structures. The first buffer layer may be formed under an inert gas atmosphere.

Removing the nano-structures may expose the nano-structures in a hydrogen ($H_2$) gas atmosphere. The voids may have a size in a range from about 100 nm to about 500 nm. The voids may be arranged in one of a single layer and a double layer. The first buffer layer may include at least one of ZnO, BN, AlN, GaN, and AlGaN.

The method may further include forming a second buffer layer on the substrate before forming the plurality of nano-structures. The second buffer layer may include at least one of ZnO, BN, AlN, GaN, and AlGaN. The first buffer layer and the second buffer layer may be formed of one of a same material and different materials. The substrate may be one of a sapphire substrate, a silicon substrate, and a silicon carbide substrate. The method may further include removing at least one of the substrate and the first buffer layer.

According to another example embodiment of the inventive concepts, a nitride semiconductor includes the nitride semiconductor layer that is grown using the method described above.

According to another example embodiment of the inventive concepts, a method of growing a nitride semiconductor layer includes forming at least one buffer layer on a substrate such that upper portions of a plurality of first nano-structures on the substrate are exposed, removing the first nano-structures to form first voids in the buffer layer, and growing a nitride semiconductor layer on the buffer layer.

The first voids have a size in a range from about 100 nm to about 500 nm. Forming the at least one buffer layer may include forming a first buffer layer on the substrate, and forming a second buffer layer on the first buffer layer, wherein the first nano-structures may be formed on the first buffer layer. Prior to growing the nitride semiconductor layer, the method may further include forming a third buffer layer on the second buffer layer, forming a plurality of second nano-structures on the third buffer layer, forming a fourth buffer layer on the third buffer layer such that upper portions of each of the second nano-structures are exposed, and removing the second nano-structures to form second voids in the fourth buffer layer.

In the method of growing a nitride semiconductor layer and a nitride semiconductor manufactured using the method according to an example embodiment of the inventive concepts, voids may be formed in the buffer layer by a simple method without performing an additional mask process. Through the voids, stress that occurs in a method of growing the nitride semiconductor layer may be mitigated, and thus, the occurrence of cracks in the nitride semiconductor layer may be reduced.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
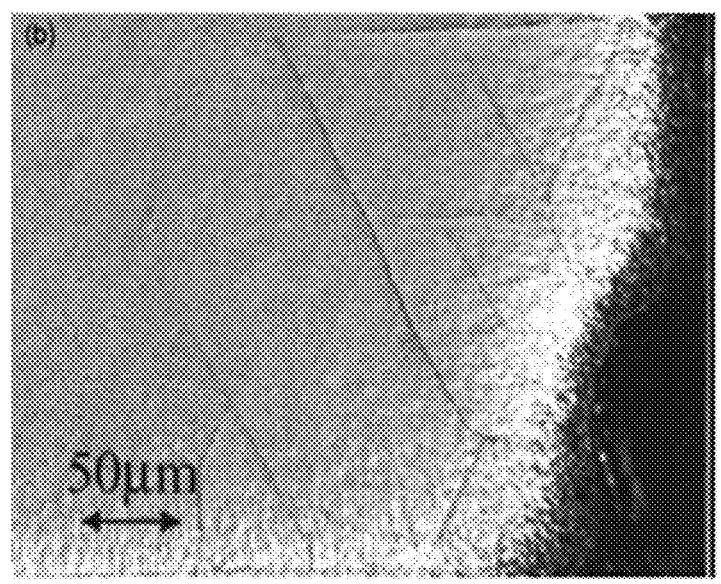
FIG. 1 is a scanning electron microscope (SEM) image of a nitride semiconductor layer grown on a buffer layer of a related art.

Reference will now be made in detail to embodiments, examples of which are illustrated in the accompanying drawings, wherein like reference numerals refer to like elements throughout and sizes of layers and thicknesses of constituent elements may be exaggerated for convenience of explanation. In this regard, the present embodiments may have different forms and should not be construed as being limited to the descriptions set forth herein. It will also be understood that when a layer is referred to as being "on" another layer or substrate, it can be directly on the other layer or substrate, or intervening layers may also be present.

It will be understood that when an element is referred to as being "connected" or "coupled" to another element, t can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with theft meaning in the context of the relevant art and will not be interpreted in an idealized or overly formal sense unless expressly so defined herein.

As it is well known in the art, a nitride semiconductor based on a nitride is generally realized in a thin film type having a two dimensional structure. However, the thin film type nitride semiconductor layer may have many defects due to a lattice constant difference and a thermal coefficient difference between a hetero-substrate formed of a different material than that used to form the nitride semiconductor layer (hereinafter, a hetero-substrate) and the nitride semiconductor layer when the thin film type nitride semiconductor layer is epitaxially grown on the hetero-substrate.

In order to mitigate the lattice constant difference between the hetero-substrate and a nitride semiconductor layer, a buffer layer may be disposed therebetween. However, simple use of a buffer layer may not be enough to greatly reduce the occurrence of defects. FIG. 1 is a scanning electron microscope (SEM) image of a nitride semiconductor layer that includes GaN and is grown on a buffer layer that includes AlGaN. Referring to FIG. 1, it is seen that cracks are formed in the nitride semiconductor layer that is grown on a hetero-substrate even though a buffer layer is used.

Current methods of reducing a potential concentration in a nitride semiconductor layer that are frequently used are a lateral epitaxial overgrowth (LEO) method and a pendeo method.

The LEO method uses a principle in which GaN does not grow on $SiO_2$ or $Si_3N_4$. That is, the LEO method includes forming patterns having a given (or, alternatively predetermined) shape on a sapphire substrate by using $SiO_2$ or $Si_3N_4$ and then growing a GaN epitaxial layer only on regions where the sapphire substrate is exposed.

The pendeo method includes growing a GaN epitaxial layer, forming a groove by etching a portion of a pattern after forming the pattern on the GaN epitaxial layer and re-growing a GaN epitaxial layer on a resultant structure. Both of the two methods are methods of controlling or repressing that defects formed at an interface between the sapphire substrate and the GaN epitaxial layer moves to a surface of the GaN epitaxial layer by changing the direction of dislocation, which is generated during a process of growing the GaN epitaxial layer and is propagated to the surface, to the lateral side of the GaN epitaxial layer.

However, the methods include complicated processes, such as, forming a mask layer on a substrate, patterning the mask layer, and the like. Also, in order to provide roughness or curves, a dry etching is mainly used, and thus, defects, such as vacancies, impurities, residues of dry etching, or physical damage, may occur on a surface of a semiconductor after the dry etching, thereby reducing the efficiency of a device. Furthermore, a non-stoichiometric surface is formed due to dry etching, and thus, the reliability of the device may deteriorate and the lifetime of the device may be reduced.

A method of growing a nitride semiconductor layer, according to an example embodiment, and the nitride semiconductor layer manufactured by using the same may reduce process cost and improve the problem of reducing reliability of the nitride semiconductor, by forming voids in a buffer layer and by not performing complicated processes, such as a process of forming a mask layer on a substrate and a process of patterning the mask layer.

Figure 2:
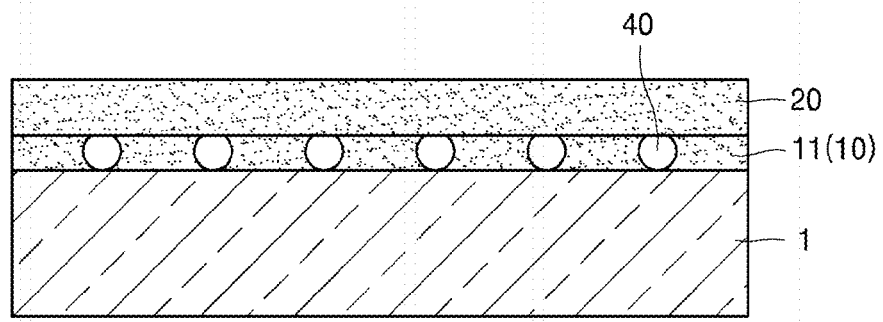
FIG. 2 is a schematic cross-sectional view of a nitride semiconductor according to an example embodiment of the inventive concepts.
Figure 3:
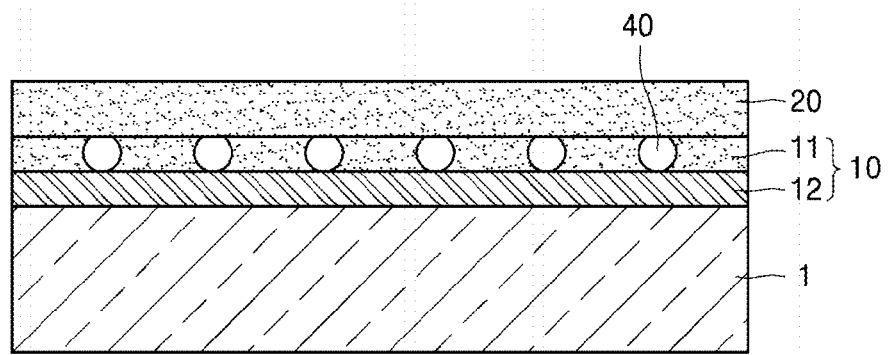
FIG. 3 is a schematic cross-sectional view of a nitride semiconductor according to another example embodiment of the inventive concepts.
Figure 4:
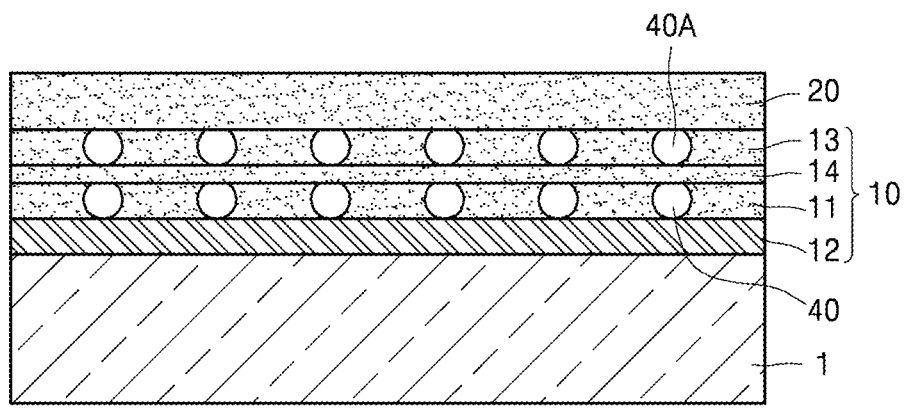
FIG. 4 is a schematic cross-sectional view of a nitride semiconductor according to another example embodiment of the inventive concepts.

FIG. 2 is a schematic cross-sectional view of a nitride semiconductor according to an example embodiment of the inventive concepts. FIGS. 3 and 4 are schematic cross-sectional views of a nitride semiconductor according to another example embodiment of the inventive concepts.

Referring to FIG. 2, the nitride semiconductor according to the current embodiment may include a substrate 1, a buffer layer 10 formed on the substrate 1, and a nitride semiconductor layer 20 formed on the buffer layer 10.

The substrate 1 may be hetero-substrate that is formed of a different material than that used to form the nitride semiconductor layer 20. For example, the substrate 1 may be one of a sapphire substrate, a silicon substrate, and a silicon carbide substrate. The substrate 1 may be a conductive substrate.

The buffer layer 10 is formed on the substrate 1, and may include a plurality of voids 40. Since the buffer layer 10 includes the voids 40, the buffer layer 10 may be readily compressed when an external force is applied. This characteristic may reduce stress that may occur due to a thermal coefficient difference between the substrate 1 and the nitride semiconductor layer 20.

The voids 40 may have a size (diameter) in a range from about 1 nm to about 1000 nm, or in a range from about 100 nm to about 500 nm. The size of the voids 40 may be uniform as depicted in FIG. 2, but is not limited thereto. That is, unlike the size depicted in the drawing, the voids 40 may have different sizes each other or some of them may have different sizes. The voids 40 may have various shapes, for example, the cross-sectional shape of the voids 40 may be a circular shape, a polygonal shape, or an oval shape. The size and shape of the voids 40 may vary according to the size and shape of nano-structures 41 which will be described below.

The buffer layer 10 may have a single layer structure or a multi-layer structure. As an example of the single layer of the buffer layer 10, the buffer layer 10 may be formed on the substrate 1 and includes the voids 40.

As an example of the multi-layer of the buffer layer 10 (see FIG. 3) the buffer layer 10 may include a first buffer layer 12 and a second buffer layer 11. The first buffer layer 12 may be formed on the substrate 1, and the second buffer layer 11 may be formed on the first buffer layer 12 and may include the voids 40. In FIGS. 2 and 3, it is depicted that the voids 40 are arranged in the second buffer layer 11 as a single layer, but the current embodiment is not limited thereto. As depicted in FIG. 4, voids 40 and 40A may be arranged in a double layer in the buffer layer 10. Here, the differentiation of second and fourth buffer layers 11 and 13 and first and third buffer layers 12 and 14 is made according to whether voids 40 and 40A are included or not.

The first buffer layer 12, the second buffer layer 11, the third buffer layer 14, and the fourth buffer layer 13 may include at least one of ZnO, BN, AlN, GaN, and AlGaN. The first buffer layer 12 and the second buffer layer 11 may be formed of the same material or different materials. The third buffer layer 14 and the fourth buffer layer 13 may be formed of the same material or different materials. For example, the second buffer layer 11 may be formed of AlGaN or AlN, and the first buffer layer 12, the third buffer layer 14, and the fourth buffer layer 13 may be formed of GaN.

The nitride semiconductor layer 20 may be formed on the buffer layer 10, For example, the nitride semiconductor layer 20 may be epitaxially grown. The nitride semiconductor layer 20 is a semiconductor layer based on a nitride and may include GaN. For example, the nitride semiconductor layer 20 may be $In_xAl_yGa_{1-x-y}N$, where $0 \leq x$, $0 \leq y$, and $x+y \leq 1$.

Figure 5:
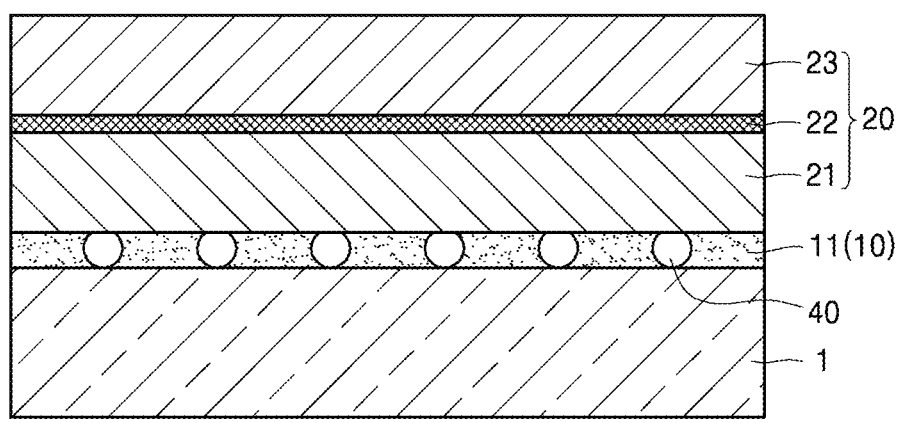
FIG. 5 is a schematic cross-sectional view of a nitride semiconductor according to another example embodiment of the inventive concepts.

The nitride semiconductor layer 20 may have a single layer structure or a multi-layer structure for manufacturing an electronic device or a light-emitting device. FIG. 5 is a schematic cross-sectional view of a nitride semiconductor according to another example embodiment of the inventive concepts. Referring to FIG. 5, a nitride semiconductor layer 20 may include a first conductive GaN layer 21, an active layer 22, and a second conductive GaN layer 23.

The first conductive GaN layer 21 may be formed on the buffer layer 10, and may be a GaN layer doped with a first conductive type dopant. The first conductive type dopant may be an n-type dopant, and may include Si, Ge, Se, and Te. The first conductive GaN layer 21 may be grown by using a metal-organic chemical vapor deposition (MOCVD) method, a hydride vapor phase epitaxy (HVPE) method, or a molecular beam epitaxy (MBE) method.

The active layer 22 is disposed between the first conductive GaN layer 21 and the second conductive GaN layer 23, and emits light having a given (or, alternatively predetermined) energy by recombination of electrons and holes. The active layer 22 may be formed of a semiconductor material, such as $In_{1-x}Ga_xN$ (where 0<x<1) so that a band gap energy thereof is controlled according to the content of indium (In), The active layer 22 may be a multi-quantum well (MQW) layer in which a quantum barrier layer and a quantum well layer are alternately stacked.

The second conductive GaN layer 23 is formed on the active layer 22, and may be a GaN layer doped with a second conductive type dopant. The second conductive type dopant may be a p-type dopant, and may include Mg, Zn, and Be. The second conductive GaN layer 23 may be grown by using the MOCVD method, the HVPE method, and the MBE method. In the current embodiment, the first conductive GaN layer 21 and the second conductive GaN layer 23 are respectively an n-type GaN layer and a p-type GaN layer. However, the first conductive GaN layer 21 and the second conductive GaN layer 23 respectively may be a p-type GaN layer and an n-type GaN layer.

FIGS. 6A through 6D are schematic cross-sectional views showing a method of growing the nitride semiconductor layer 20 depicted in FIG. 2, according to an example embodiment of the inventive concepts.

Figure 6A:
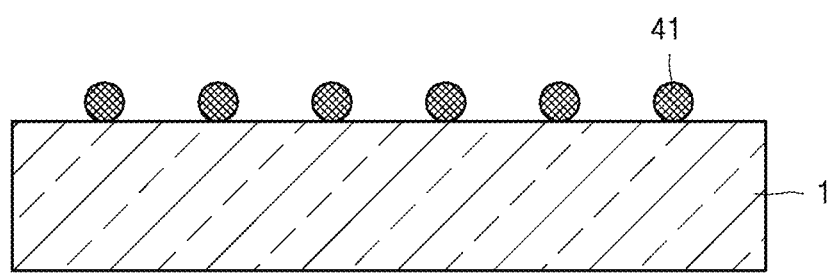
FIGS. 6A through 6D are schematic cross-sectional views showing a method of growing the nitride semiconductor layer depicted in FIG. 2, according to an example embodiment of the inventive concepts.

Referring to FIG. 6A, first, the substrate 1 is prepared, and the nano-structures 41 are formed on the substrate 1.

The substrate 1 may be a hetero-substrate that is formed of a different material than that of the nitride semiconductor layer 20 to be grown. For example, the substrate 1 may be one of a sapphire substrate, a silicon substrate, and a silicon carbide substrate. The substrate 1 may be a conductive substrate.

The nano-structures 41 may include an oxide. For example, the nano-structures 41 may include at least one of $SiO_2$, $TiO_2$, $\beta$-$Ga_2O_3$, $Ta_2O_5$, and $RuO_2$.

The size (diameter) of the nano-structures 41 may be in a range from about 1 nm to about 1000 nm, and more specifically, in a range from about 100 nm to about 500 nm. The cross-sectional shape of the nano-structures 41 may have various shapes, for example, a circular shape, a polygonal shape, or an oval shape.

The nano-structures 41 may be formed on the substrate 1 by using a coating method, for example, a spin coating method. The spin coating method is a wet process that uses a solution in which the nano-structures 41 are dispersed in an appropriate solvent. The arrangement of the nano-structures 41 may be controlled by controlling the concentration of the solvent and the spin velocity, etc.

Figure 7:
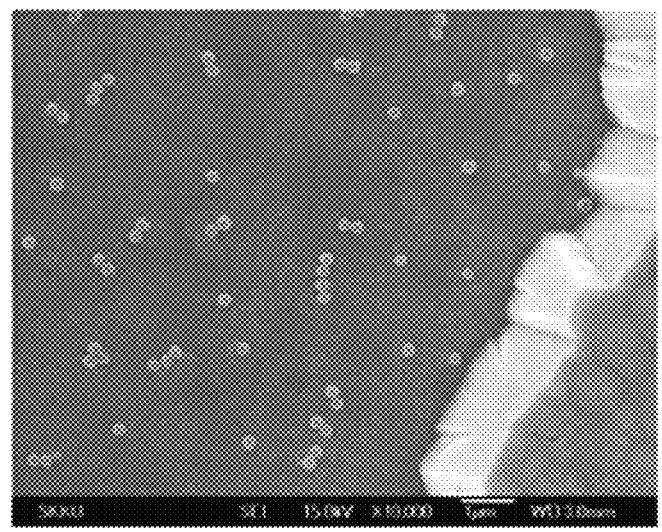
FIG. 7 is an SEM image of a plurality of nano-structures formed on a substrate by using a spin coating method.

FIG. 7 is an SEM image of a plurality of nano-structures formed on a substrate by using a spin coating method. As depicted in FIG. 7, it is seen that, without an additional mask process, the nano-structures 41 are arranged on the substrate 1 by a spin coating method.

Figure 6B:
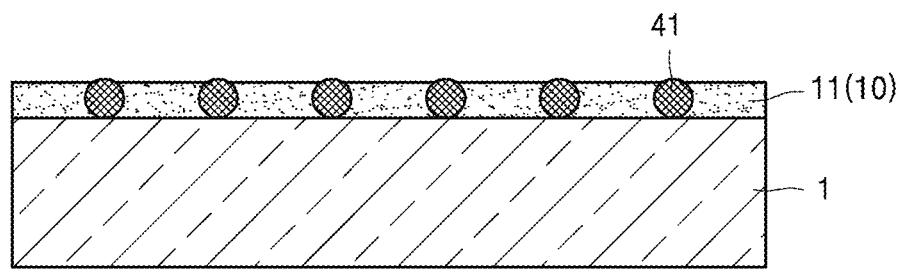

Referring to FIG. 6B, the first buffer layer 10 is formed on the substrate 1, and a portion of each of the nano-structures 41 remains exposed. Since a portion of each of the nano-structures 41 is exposed, voids 40 may be formed by removing the nano-structures 41 in a subsequent process (refer to FIG. 6C).

As an example of forming the first buffer layer 10 with exposing a portion of each of the nano-structures 41, the first buffer layer 10 may be formed to have a thickness that is smaller than that of the nano-structures 41. Thus, the first buffer layer 10 may expose an upper portion of each the nano-structures 41. The first buffer layer 10 may have a thickness that is equal to or greater than at least 50% of that of the nano-structures 41. If the first buffer layer 10 has a thickness that is smaller than 50% of that of the nano-structures 41, the voids 40 may not be maintained when the nitride semiconductor layer 20 to be formed in a subsequent process covers the voids 40.

The first buffer layer 10 may include at least one of ZnO, BN, AlN, GaN, and AlGaN. For example, the first buffer layer 10 may include GaN. The first buffer layer 10 may be grown at a temperature in a range from about 800° C. to about 1100° C. under an inert gas atmosphere. In order to make an inert gas atmosphere, a nitrogen ($N_2$) gas or an argon (Ar) gas may be used. Since the first buffer layer 10 is formed under an inert gas atmosphere, ashing of the nano-structures 41 in the process of forming the first buffer layer 10 may be prevented or inhibited, if the nano-structures 41 are ashed in the method of growing the first buffer layer 10, the voids 40 are not formed in the first buffer layer 10.

Figure 6C:
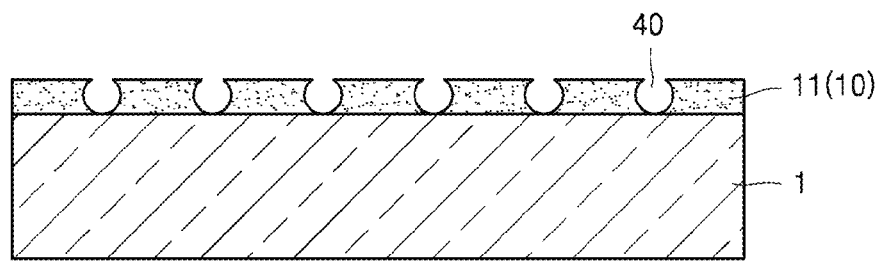

Referring to FIG. 6C, the nano-structures 41 are removed from the first buffer layer 10. The voids 40 may be formed by removing the nano-structures 41 from the first buffer layer 10.

As a method of removing the nano-structures 41, the nano-structures 41 may be exposed in a hydrogen ($H_2$) atmosphere. For example, when the nano-structures 41 include an oxide, the nano-structures 41 exposed in the $H_y$ atmosphere may be removed by a chemical reaction between the oxide and hydrogen.

The first buffer layer 10 from which the nano-structures 41 are removed may have voids corresponding to the nano-structures 41. The size and shape of the voids 40 may vary according to the size and shape of the nano-structures 41. For example, the voids 40 may have a size in a range from about 1 nm to about 1000 nm, or in a range from about 100 nm to about 500 nm. The size of the voids 40 may be uniform as depicted in FIG. 6C, but the current embodiment is not limited thereto. That is, unlike the drawing, at least some of the voids 40 may have different sizes.

Figure 6D:
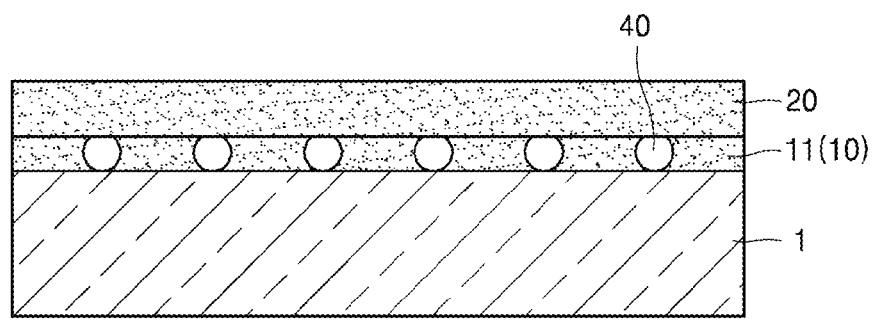

Referring to FIG. 6D, the nitride semiconductor layer 20 is formed on the first buffer layer 10 in which the voids 40 are formed. Thus, the voids 40 are sealed from the outside. In FIG. 6D, it is depicted for convenience of explanation that upper surfaces of the voids 40 are flat, but the current embodiment is not limited thereto.

The nitride semiconductor layer 20 may be epitaxially grown on the first buffer layer 10 in which the voids 40 are formed. The voids 40 may be readily compressed by external pressure. This characteristic of the voids 40 may reduce stress that occurs due to a thermal expansion coefficient difference between the substrate 1 and the nitride semiconductor layer 20, for example, stress that acts on the nitride semiconductor layer 20.

Figure 8:
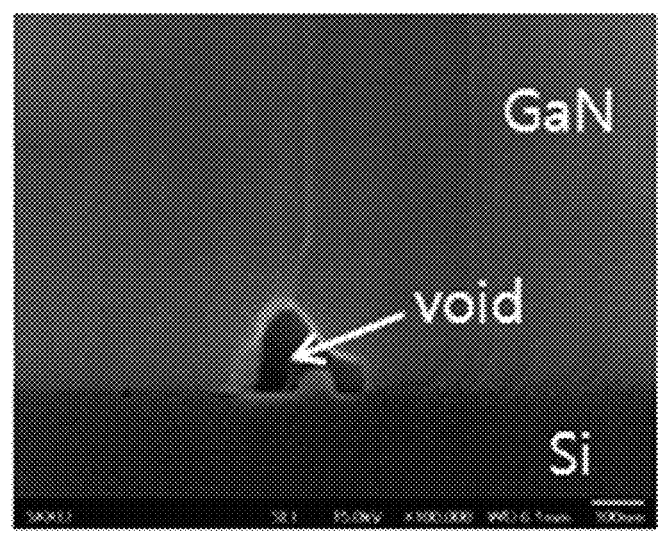
FIG. 8 is an SEM image of an actual nitride semiconductor that is grown through the processes FIGS. 6A through 6D.

FIG. 8 is an SEM image of an actual nitride semiconductor that is grown through the processes of FIGS. 6A through 6D. Referring to FIG. 8, it is confirmed that the void 40 having a given (or, alternatively predetermined) size is formed in the first buffer layer 10 that is formed of GaN, and the nitride semiconductor layer 20 that includes GaN is grown without cracks on the first buffer layer 10.

FIGS. 9A through 9D are schematic cross-sectional views showing a method of growing the nitride semiconductor layer 20 depicted in FIG. 3, according to another example embodiment of the inventive concepts. The current embodiment is practically the same as the embodiment described with reference to FIGS. 6A through 6D except the process of forming the buffer layer 10. Thus, the current embodiment will be described mainly in terms of its differences from the embodiment described with reference to FIGS. 6A through 6D and the processes described with reference to FIGS. 6A through 6D will be omitted.

Figure 9A:
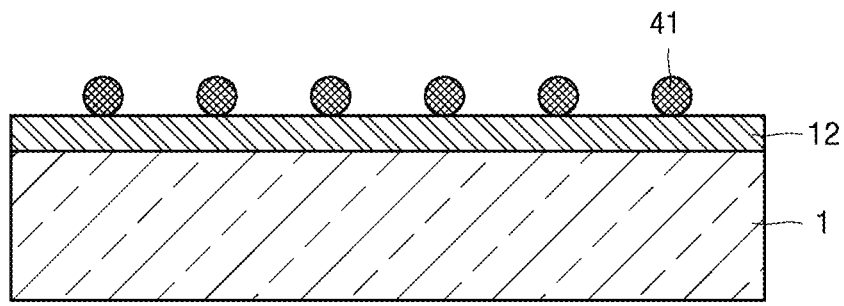
FIGS. 9A through 9D are schematic cross-sectional views showing a method of growing the nitride semiconductor layer depicted in FIG. 3, according to another example embodiment of the inventive concepts.
Figure 9B:
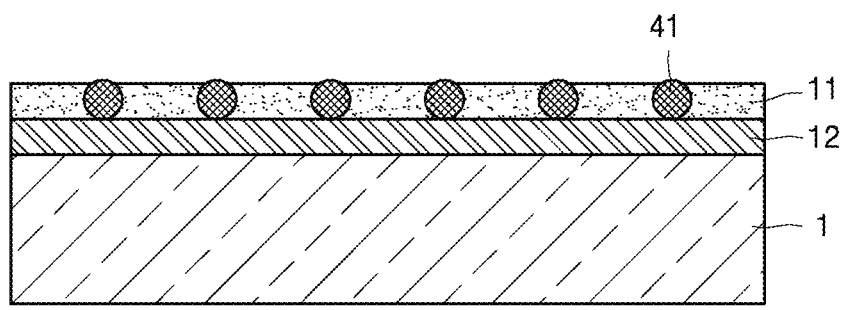
Figure 9C:
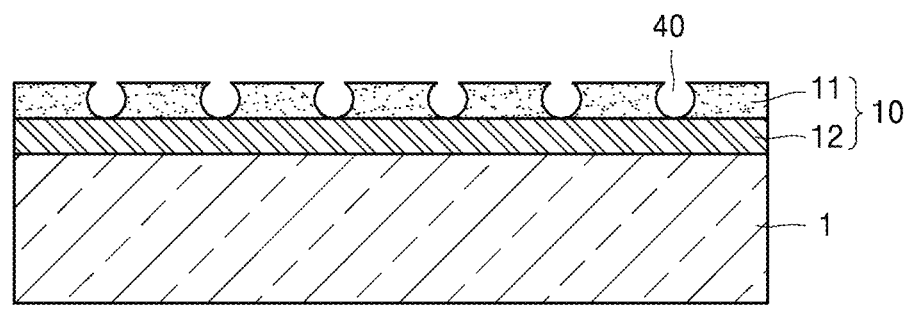
Figure 9D:
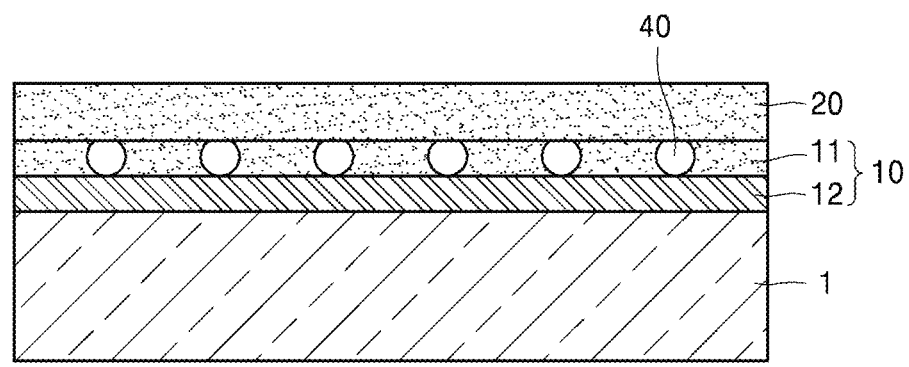

Referring to FIG. 9A, prior to forming the nano-structures 41 the first buffer layer 12 is formed on the substrate 1. The nano-structures 41 are formed on the first buffer layer 12. Since the nano-structures 41 are formed on the first buffer layer 12, the nano-structures 41 may be indirectly formed on the substrate 1.

The first buffer layer 12 may include at least one of ZnO, BN, AlN, GaN, and AlGaN. For example, the first buffer layer 12 may include GaN. The first buffer layer 12 may be formed by using various methods, for example, one of an MOCVD method, an HVPE method, and an MBE method.

The first buffer layer 12 may be formed of the same material or different materials. For example, the first buffer layer 12 may be formed of AlN or AlGaN, and the second buffer layer 11 may be formed of GaN.

FIGS. 10A through 10H are schematic cross-sectional views showing a method of growing the nitride semiconductor layer 20 depicted in FIG. 4, according to an example embodiment of the inventive concepts. The current embodiment is practically the same as the embodiment described with reference to FIGS. 9A through 9O except for an additional process for arranging the voids 40 and 40A to be a double layer. Thus, the processes described with reference to FIGS. 9A through 9D will not be repeated.

Figure 10A:
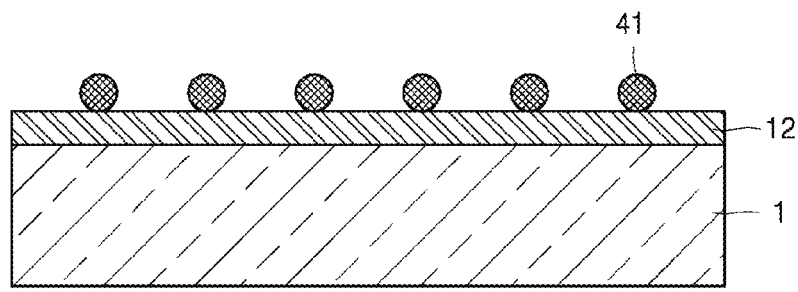
FIGS. 10A through 10H are schematic cross-sectional views showing a method of growing the nitride semiconductor layer depicted in FIG. 4, according to an example embodiment of the inventive concepts.
Figure 10B:
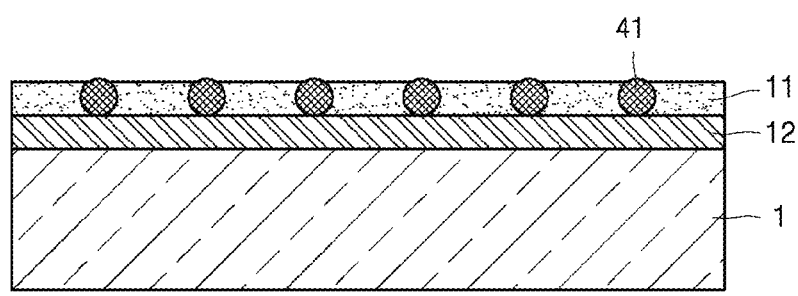
Figure 10C:
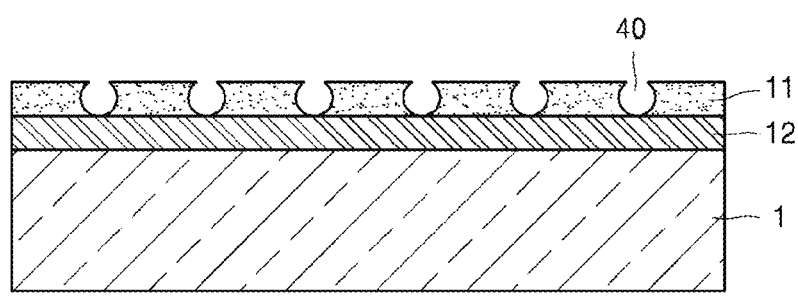
Figure 10D:
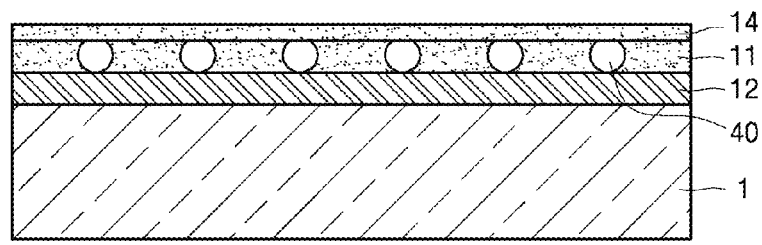

Referring to FIG. 10D, the third buffer layer 14 is formed on the second buffer layer 11 in which the voids 40 are formed, and thus, the voids 40 are sealed from the outside.

The third buffer layer 14 may include at least one of ZnO, BN, AlN, GaN, and AlGaN, For example, the third buffer layer 14 may include GaN. The third buffer layer 14 may be formed by using various methods, for example, one of an MOCVD method, an HVPE method, and an MBE method.

Figure 10E:
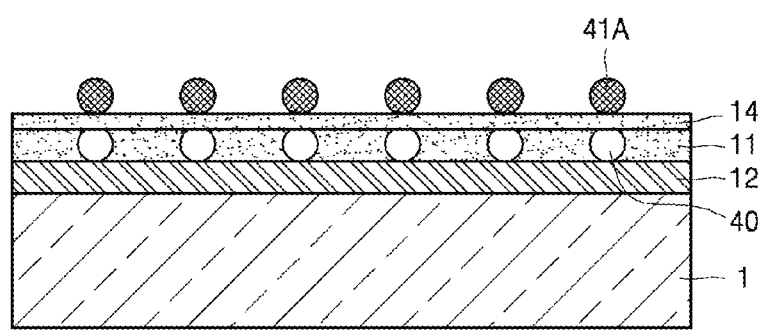

Referring to FIG. 10E, nano-structures 41A may be formed on the third buffer layer 14. The nano-structures 41A may include an oxide. For example, the nano-structures 41A may include at least one of $SiO_2$, $TiO_2$, $\beta$-$Ga_2O_3$, $Ta_2O_5$, and $RuO_2$.

The size (diameter) of the nano-structures 41A may be in a range from about 1 nm to about 1000 nm, or in a range from about 100 nm to about 500 nm. The cross-sectional shape of the nano-structures 41A may have various shapes, for example, a circular shape, a polygonal shape, or an oval shape. The nano-structures 41 and the nano-structures 41A may have the same size and shape or may have different sizes and shapes.

The nano-structures 41A may be formed on the third buffer layer 14 by using a coating method, for example, a spin coating method.

Figure 10F:
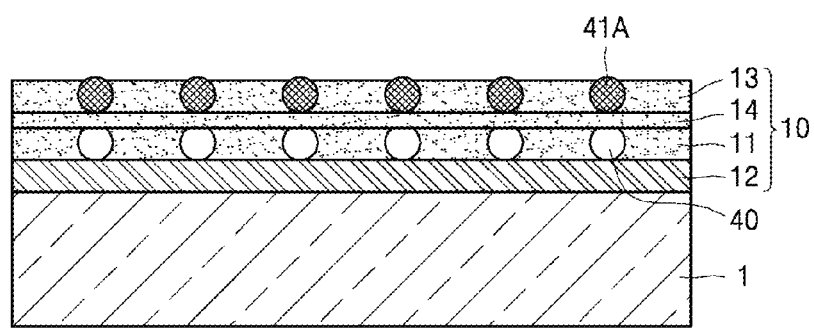

Referring to FIG. 10F, the fourth buffer layer 13 is formed on the third buffer layer 14 exposing a portion of each of the nano-structures 41A. Since a portion of each of the nano-structures 41A is exposed, the voids 40A may be maintained when the nano-structures 41A are removed in a subsequent process.

As an example of forming the fourth buffer layer 13 exposing a portion of each of the nano-structures 41A, the fourth buffer layer 13 may be formed to have a thickness that is smaller than that of the nano-structures 41A. Thus, the fourth buffer layer 13 may expose an upper portion of each the nano-structures 41A. The fourth buffer layer 13 may have a thickness that is equal to or greater than at least 50% of that of the nano-structures 41A. If the fourth buffer layer 13 has a thickness that is smaller than 50% of that of the nano-structures 41A, the voids 40A may not be maintained when the nitride semiconductor layer 20 to be formed in a subsequent process covers the voids 40A.

The third buffer layer 14 may include at least one of ZnO, BN, AlN, GaN, and AlGaN. For example, the third buffer layer 14 may include GaN. The third buffer layer 14 may be grown at a temperature in a range from about 800° C. to about 1100° C. under an inert gas atmosphere. In order to make an inert atmosphere, a nitrogen ($N_2$) gas or an argon (Ar) gas may be used. Since the third buffer layer 14 is formed under an inert gas atmosphere, ashing of the nano-structures 41A in the process of forming the third buffer layer 14 may be prevented or inhibited. If the nano-structures 41A are asked in the method of growing the third buffer layer 14, the voids 40A are not formed in the third buffer layer 14.

Figure 10G:
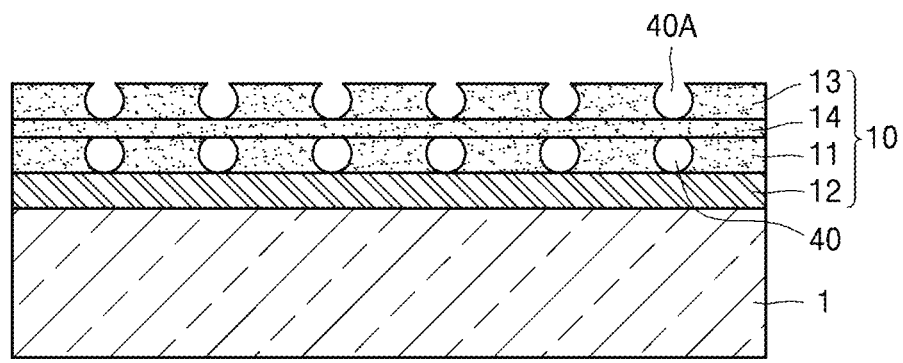

Referring to FIG. 10G, the nano-structures 41A are removed from the third buffer layer 14. The voids 40A may be formed by removing the nano-structures 41A from the third buffer layer 14.

As a method of removing the nano-structures 41A, the nano-structures 41A may be exposed in a hydrogen ($H_2$) atmosphere. For example, when the nano-structures 41A include an oxide, the nano-structures 41A exposed in the $H_2$ atmosphere may be removed by a chemical reaction between the oxide and hydrogen.

The fourth buffer layer 13 from which the nano-structures 41A are removed may have the voids 40A corresponding to the nano-structures 41A. The size and shape of the voids 40A may vary according to the size and shape of the nano-structures 41A. For example, the voids 40A may have a size in a range from about 1 nm to about 1000 nm, or in a range from about 100 nm to about 500 nm. The size of the voids 40A may be uniform as depicted in FIG. 10G, but the current embodiment is not limited thereto. That is, unlike the drawing, at least some of the voids 40A may have different sizes. Also, the voids 40 in the second buffer layer 11 and the voids 40A in the fourth buffer layer 13 may have the same size, but are not limited thereto, that is, the sizes may differ as necessary.

Figure 10H:
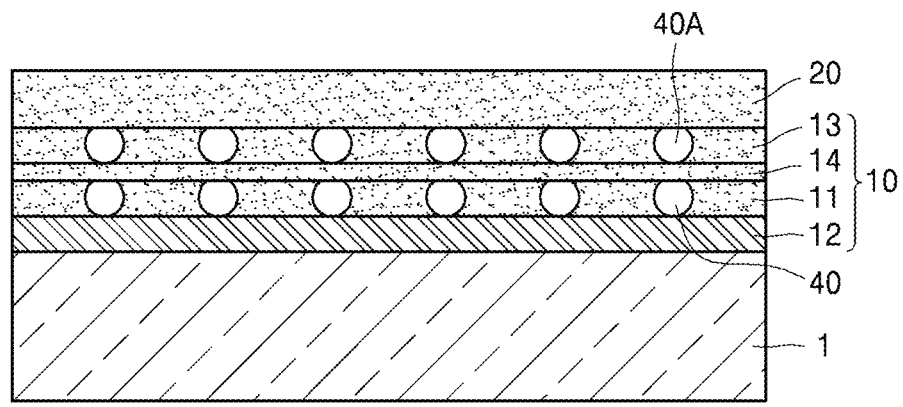

Referring to FIG. 10H, the nitride semiconductor layer 20 is formed on the fourth buffer layer 13 in which the voids 40A are formed. In this manner, the voids 40A are sealed from the outside.

The nitride semiconductor layer 20 may be epitaxially formed on the buffer layer 10 in which a double layer of voids 40 and 40A are formed. The voids 40 in the second buffer layer 11 and the voids 40A in the fourth buffer layer 13 may be further readily compressed when an external pressure is applied. This characteristic may reduce stress that may occur due to a thermal coefficient difference between the substrate 1 and the nitride semiconductor layer 20, that is, stress that is applied to the nitride semiconductor layer 20 may be effectively mitigated.

In the current embodiment, as an example, a double layer of the voids 40 and 40A is mainly described with reference to FIGS. 10A through 10H. However, a triple layer of the voids 40 and 40A or more may be formed by repeating the process described above.

It should be understood that example embodiments described therein should be considered in a descriptive sense only and not for purposes of limitation. Descriptions of features or aspects within each embodiment should typically be considered as available for other similar features or aspects in other embodiments.

While one or more example embodiments of the inventive concepts have been described with reference to the figures, it will be understood by those of ordinary skill in the art that various changes in form and details may be made therein without departing from the spirit and scope of the following claims.

What is claimed is:

1. A method of growing a nitride semiconductor layer, the method comprising:
   forming a plurality of nano-structures on a substrate;
   forming a first buffer layer on the substrate such that upper portions of each of the nano-structures are exposed;
   removing the nano-structures to form voids in the first buffer layer; and
   growing a nitride semiconductor layer on a top surface of the first buffer layer such that the voids are surrounded laterally by the first buffer layer.

2. The method of claim 1, wherein the forming a plurality of nano-structures forms the nano-structures using a spin coating method.

3. The method of claim 1, wherein the forming a plurality of nano-structures forms the nano-structures to have a size in a range from about 100 nm to about 500 nm.

4. The method of claim 1, wherein the forming a plurality of nano-structures forms the nano-structures including an oxide.

5. The method of claim 4, wherein the forming a plurality of nano-structures forms the nano-structures including at least one of $SiO_2$, $TiO_2$, $\beta\text{-}Ga_2O_3$, $Ta_2O_5$, and $RuO_2$.

6. The method of claim 1, wherein the forming a first buffer layer forms the first buffer layer having a thickness that is smaller than that of the nano-structures.

7. The method of claim 1, wherein the forming a first buffer layer forms the first buffer layer under an inert gas atmosphere.

8. The method of claim 1, wherein the removing the nano-structures exposes the nano-structures in a hydrogen ($H_2$) gas atmosphere.

9. The method of claim 1, wherein the removing the nano-structures forms the voids to have a size in a range from about 100 nm to about 500 nm.

10. The method of claim 1, wherein the removing the nano-structures forms the voids to be arranged in one of a single layer and a double layer.

11. The method of claim 1, wherein the forming a first buffer layer forms the first buffer layer including at least one of ZnO, BN, AlN, GaN, and AlGaN.

12. The method of claim 1, further comprising:
    forming a second buffer layer on the substrate before the forming a plurality of nano-structures.

13. The method of claim 12, wherein the forming a second buffer layer forms the second buffer layer including at least one of ZnO, BN, AlN, GaN, and AlGaN.

14. The method of claim 13, wherein the first buffer layer and the second buffer layer are formed of one of a same material and different materials.

15. The method of claim 1, wherein the substrate is one of a sapphire substrate, a silicon substrate, and a silicon carbide substrate.

16. The method of claim 1, further comprising:
    removing at least one of the substrate and the first buffer layer.

17. A method of growing a nitride semiconductor layer, the method comprising:
    forming at least one buffer layer on a substrate such that upper portions of a plurality of first nano-structures on the substrate are exposed;
    removing the first nano-structures to form first voids in the buffer layer; and
    growing a nitride semiconductor layer on a top surface of the buffer layer such that the first voids are surrounded laterally by the buffer layer.

18. The method of claim 17, wherein the removing the first nano-structures forms the first voids to have a size in a range from about 100 nm to about 500 nm.

19. The method of claim 17, wherein the forming at least one buffer layer comprises:
    forming a first buffer layer on the substrate; and
    forming a second buffer layer on the first buffer layer,
    wherein the first nano-structures are formed on the first buffer layer.

20. The method of claim 19, prior to the growing a nitride semiconductor layer, further comprising:
    forming a third buffer layer on the second buffer layer;
    forming a plurality of second nano-structures on the third buffer layer;
    forming a fourth buffer layer on the third buffer layer such that upper portions of each of the second nano-structures are exposed; and
    removing the second nano-structures to form second voids in the fourth buffer layer.

* * * * *